United States Patent [19]

Dutton

[11] Patent Number: 4,654,847
[45] Date of Patent: Mar. 31, 1987

[54] APPARATUS FOR AUTOMATICALLY CORRECTING ERRONEOUS DATA AND FOR STORING THE CORRECTED DATA IN A COMMON POOL ALTERNATE MEMORY ARRAY

[75] Inventor: Patrick F. Dutton, Endicott, N.Y.

[73] Assignee: International Business Machines, Armonk, N.Y.

[21] Appl. No.: 687,401

[22] Filed: Dec. 28, 1984

[51] Int. Cl.⁴ .................... G06F 11/14; G06F 11/16
[52] U.S. Cl. .......................................... 371/10; 371/38
[58] Field of Search ................... 371/10, 38; 365/200; 364/200, 900

[56] References Cited

U.S. PATENT DOCUMENTS

| | | | |
|---|---|---|---|
| 3,222,653 | 12/1965 | Rice | 364/172.5 |
| 3,588,830 | 6/1971 | Duda | 365/200 X |
| 3,633,175 | 1/1972 | Harper | 340/172.5 |
| 3,659,275 | 4/1972 | Marshall | 340/173 |
| 3,868,646 | 2/1975 | Bergman | 340/172.5 |
| 4,093,985 | 6/1978 | Das | 364/200 |
| 4,310,901 | 1/1982 | Harding et al. | 365/200 |
| 4,380,066 | 4/1983 | Spencer | 371/10 |
| 4,394,763 | 7/1983 | Nagano et al. | 371/38 |
| 4,450,559 | 5/1984 | Bond | 371/10 |
| 4,456,993 | 6/1984 | Minato et al. | 371/10 |
| 4,558,446 | 12/1985 | Banba | 371/10 |

Primary Examiner—Jerry Smith
Assistant Examiner—Robert W. Beausoliel, Jr.
Attorney, Agent, or Firm—Curtis G. Rose; John H. Bouchard; Shelley M. Beckstrand

[57] ABSTRACT

An apparatus is disclosed which detects the existence of an error, in a computer system, corrects the error, and takes steps to ensure that the error will never again re-occur. The error resides in the integrity of data stored in a main memory. When the data is read from memory and found to be erroneous, the data is corrected and stored in a spare portion of a small alternate memory array. In addition, the identity of the corrected data is also stored in the alternate memory array. During a subsequent read of the data from the main memory, the alternate memory array is simultaneously consulted. The identity of the corrected data, stored in the alternate memory array, is compared with the incoming address, and the corrected data is read from the spare portion of the alternate memory array. As a result, the erroneous data is not reproduced during a subsequent read of the data from the main memory.

2 Claims, 9 Drawing Figures

APPARATUS FOR AUTOMATICALLY CORRECTING ERRONEOUS DATA AND FOR STORING THE CORRECTED DATA IN A COMMON POOL ALTERNATE MEMORY ARRAY

BACKGROUND OF THE INVENTION

1. Field of the Invention

The present invention relates to a computer system, and more particularly, to an error sensing and correction apparatus within said computer system for automatically sensing the existence of an error in data stored within said computer system, for correcting the erroneous data, and for ensuring that the error will never be reproduced.

2. Description of the Prior Art

A memory often includes a plurality of integrated circuit chips. The integrated circuit chips each include a plurality of cells. If one or more cells of an integrated circuit chip in the memory fail, the binary data, stored in the cells, is erroneously changed. When the data is read from the memory, the erroneous binary data is included as part of the data read from memory.

Various schemes have been devised to detect the existence of the erroneous data, to correct the data, and to take steps to ensure that the corrected data will be retrieved from memory when the memory is subsequently addressed. For example, application Ser. No. 531,793, filed Sept. 13, 1983, now U.S. Pat. No. 4,608,687 entitled Bit Steering Apparatus and Method for Correcting Errors in Stored Data, Storing the Address of the Corrected Data and Using the Address to Maintain a Correct Data Condition, discloses such a scheme. In addition, application Ser. No. 528,769, filed Sept. 2, 1983, entitled "Memory Correction Scheme Using Spare Arrays" also discloses such a scheme. The above applications are assigned to the same assignee as that of the present invention. In both of the above referenced applications, when erroneous data, withdrawn from a memory unit, is detected, the identity of at least one bit of the erroneous data is determined and, when the erroneous bit is corrected, the identity of the corrected bit is stored in a special store and the corrected bit is stored in a spare unit in the memory unit. In the former above referenced application, the special store is a component located off the memory unit while, in the latter above referenced application, the special store is a component located within the memory unit. In both applications, however, the one bit of the corrected data is stored in a spare unit in the memory unit. A multiple number of spare units are available within the memory unit for this purpose.

As the technology associated with computing systems advances, the failure rates associated with the data withdrawn from the memory unit of the computing systems decrease. As these failure rates decrease, the need for the multiple number of spare units within the memory unit also decreases. However, since some failures will always occur, although the failure rates are low, the need for a spare unit, for the storage of corrected data, still exists.

SUMMARY OF THE INVENTION

It is a primary object of the present invention to improve the performance of the error correction and prevention apparatus of the prior art by connecting a small, but separate alternate memory array to the main memory, the alternate memory array containing the address of the corrected data when stored in the memory unit, the identity of corrected data in terms of its bit and byte position within the data, and the corrected data itself.

It is another object of the present invention to connect the alternate memory array to the main memory in a manner such that the alternate memory is addressed simultaneously with the main memory, the small size of the alternate memory permitting immediate access to the corrected data stored therein.

In accordance with these and other objects of the present invention, when a read request is received by a memory unit, data is read from the memory unit and temporarily stored in an error correction matrix. In the matrix, the data is tested for existence of a single bit error or a double bit error.

Concurrently with the read request, an alternate memory array is addressed to determine if part of the data, to be read from memory, should be read from a spare location within the alternate memory or from one of a plurality of memory chips designated for storage of the data. The alternate memory array is very small relative to the memory unit, for example, the alternate memory array may be approximately 768 cells in size whereas the memory unit may be approximately 75.5 million cells in size. If certain specific coded information is present in the alternate memory array, one of the bits of the data to be read from the memory unit, representing the corrected data, is read from a spare location within the alternate memory array while the other bits of data to be read from the memory unit are read from the memory unit itself.

If a single bit error exists in said data, and the alternate memory does not indicate that the data associated with the single bit error should be read from the spare location in the alternate memory array, an error correction matrix corrects the bit in error. The data is then transmitted to a user or to a processor for further processing. However, if a double bit error exists in said data, and the alternate memory does not indicate that at least one bit of the data associated with the double bit error should be read from the spare location in the alternate memory, the error correction matrix cannot correct the two bits in error because it is not capable of determining which specific two bits are the erroneous bits. Therefore, the error correction matrix notifies a separate memory and a processor regarding the existence of the double bit error. The processor utilizes a program stored in the separate memory to determine the identity of the specific two bits constituting the double bit error and to correct the erroneous bits. The processor updates the alternate memory array to indicate the address of one of the two bits constituting the double bit error stored in the main memory, to indicate the identity of the one bit in terms of its byte location at said address and its bit location within the byte, and to store the corrected bit associated with the one bit therein. When the processor reads the same data, associated with the double bit error, from the memory unit, since the alternate memory has been updated, the one of the two bits is read from the spare location of the alternate memory array and the other of the two bits, constituting the double bit error, is read from its original location within the memory unit. Since the one of the two bits is read from the spare location in the alternate memory array (this bit representing a corrected bit), the double bit error has been reduced to a single bit error. When the other of the two bits is read from its original location within the memory unit, an erroneous bit is again withdrawn from memory. However, the error correction matrix is capable of automatically correcting the single bit error.

As a result of the alternate memory array, and the manner of its connection to the memory unit, during a subsequent read of the memory unit, at an address corresponding to the defective memory location within the memory unit, one bit of the corrected data is retrieved from the spare location within the alternate memory array during a first read cycle, that is, when the memory unit is first read for the purpose of retrieving the corrected data. Therefore, contrary to the prior art, the original double bit error will never again re-occur. As a result, an improvement in the performance of the computer system of the prior art is noted. Furthermore, due to the small size of the alternate memory array, relative to the memory unit, during the first read cycle, nearly immediate access is given to the corrected data stored in the spare location of the alternate memory array.

Further scope of applicability of the present invention will become apparent from the detailed description given hereinafter. However, it should be understood that the detailed description and the specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

A full understanding of the present invention will be obtained from a reading of the detailed description given hereinbelow and the accompanying drawings, which are given by way of illustration only, and thus are not limitative of the present invention, and wherein.

DETAILED DESCRIPTION OF THE PREFERRED EMBODIMENT

Figure 1:
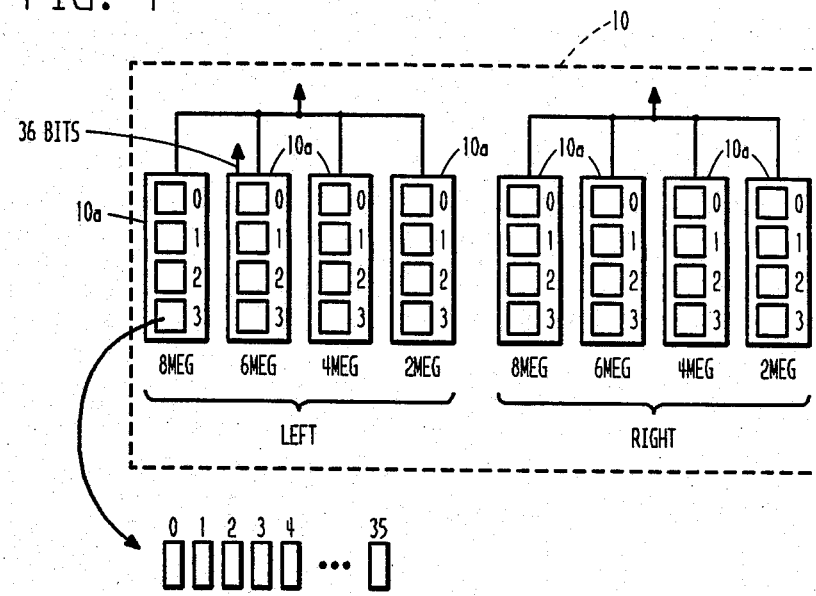
FIG. 1 illustrates a plurality of memory cards in the memory unit, each card comprising a plurality of memory groups, each group comprising a plurality of memory chips, each chip storing a portion of the data stored in the memory unit.

FIG. 1 illustrates a plurality of memory cards 10a disposed within a memory unit 10. In FIG. 1, a memory card 10a includes four groups of chips (groups 0 through 3). A group comprises, in the preferred embodiment, thirty-six (36) integrated circuit (I.C.) chips (0–35). Each chip stores 64K bits of data.

Figure 2:
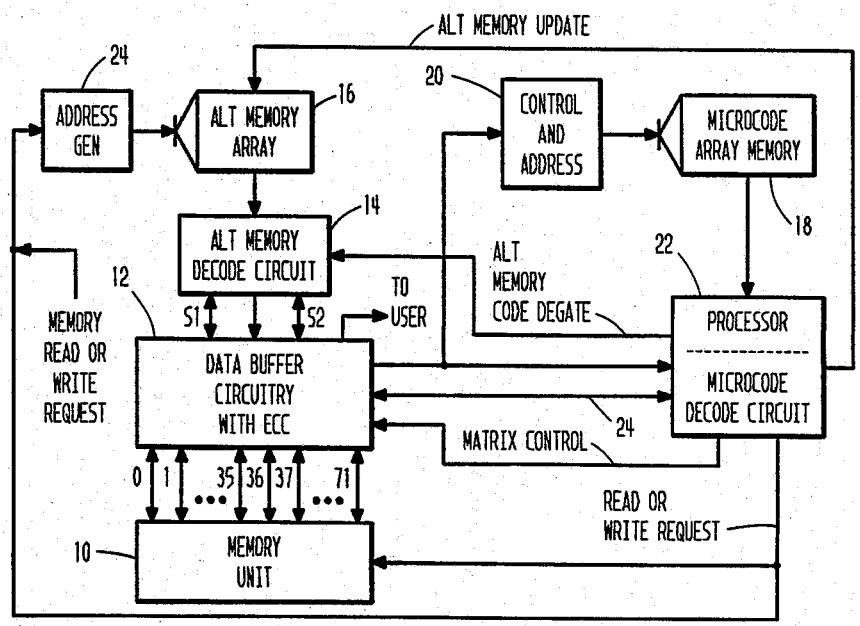
FIG. 2 illustrates the apparatus of the present invention for automatically detecting an error, in particular, a double bit error associated with data withdrawn from a memory unit, for correcting the error, and for ensuring that said error will never again re-occur by storing certain information in a smaller, alternate memory array relating to one bit of the double bit error.

FIG. 2 illustrates an apparatus, according to the present invention, for automatically detecting the existence of defective bits of data stored in a memory chip, for correcting the defective bits of data, and for ensuring that at least some of the defective bits of data will never again be reproduced during a subsequent withdrawal of data from the memory chip. In FIG. 2, each chip of each group of a memory card 10a disposed within the memory unit 10 is connected to a data buffer circuit 12 via a plurality of lines, labelled 0–35, 36–71 corresponding to chips 0–35 associated with a first memory card and a second memory card, respectively. The data buffer circuit 12 is connected to an alternate memory array 16 via an alternate memory decode circuit 14. The alternate memory 16 is approximately 768 cells in size whereas the memory unit 10 is approximately 75.5 million cells in size. The data buffer circuit 12 includes an error correction code matrix (ECC) for determining if a single bit error or a double bit error exists in the data read from memory unit 10. The alternate memory array 16 contains information relative to the operative condition of each chip of each group within each memory card 10a of the memory unit 10. The alternate memory decode circuit 14 decodes the information stored in the alternate memory array 16, the decoded information being used by the data buffer circuit 12 to select either the corrected data stored in the alternate memory 16 or the data stored in a chip of a group of a memory card in the memory unit 10.

The data buffer circuit 12 is connected to a microcode array memory 18 via a control and address circuit 20. The data buffer circuit 12 is also connected to a processor 22 (otherwise known as a microcode decode circuit). The memory 18 stores a program used for determining the identity of the specific bits which constitute a double bit error, and for correcting the specific bits. The processor 22 executes the instructions of the program stored in the microcode array memory 18. The processor 22 is connected to the alternate memory array 16, via the "alt memory update" line, for updating the alternate memory array 16 to store the address in memory unit 10 associated with one of the specific bits which constitute the double bit error, to store the identity of the one bit, in terms of its byte and bit location at said address, which constitutes the double bit error, and to store a corrected bit representing the one bit as determined by the processor 22 and the program stored in memory 18. The processor 22 is further connected to the alternate memory decode circuit 14 via an "alternate memory code degate" line for disabling the functioning of the alternate memory array 16, to the data buffer circuitry 12 via a "matrix control" line for disabling the functioning of the error correction matrix, and to the memory unit 10 via a "read or write request" line.

When a memory read or write request is developed from an external source, the request is received by an address generator 24 connected to the alternate memory 16. The request is further received by the memory unit 10 wherein the data to be read is initially stored.

Figure 3:
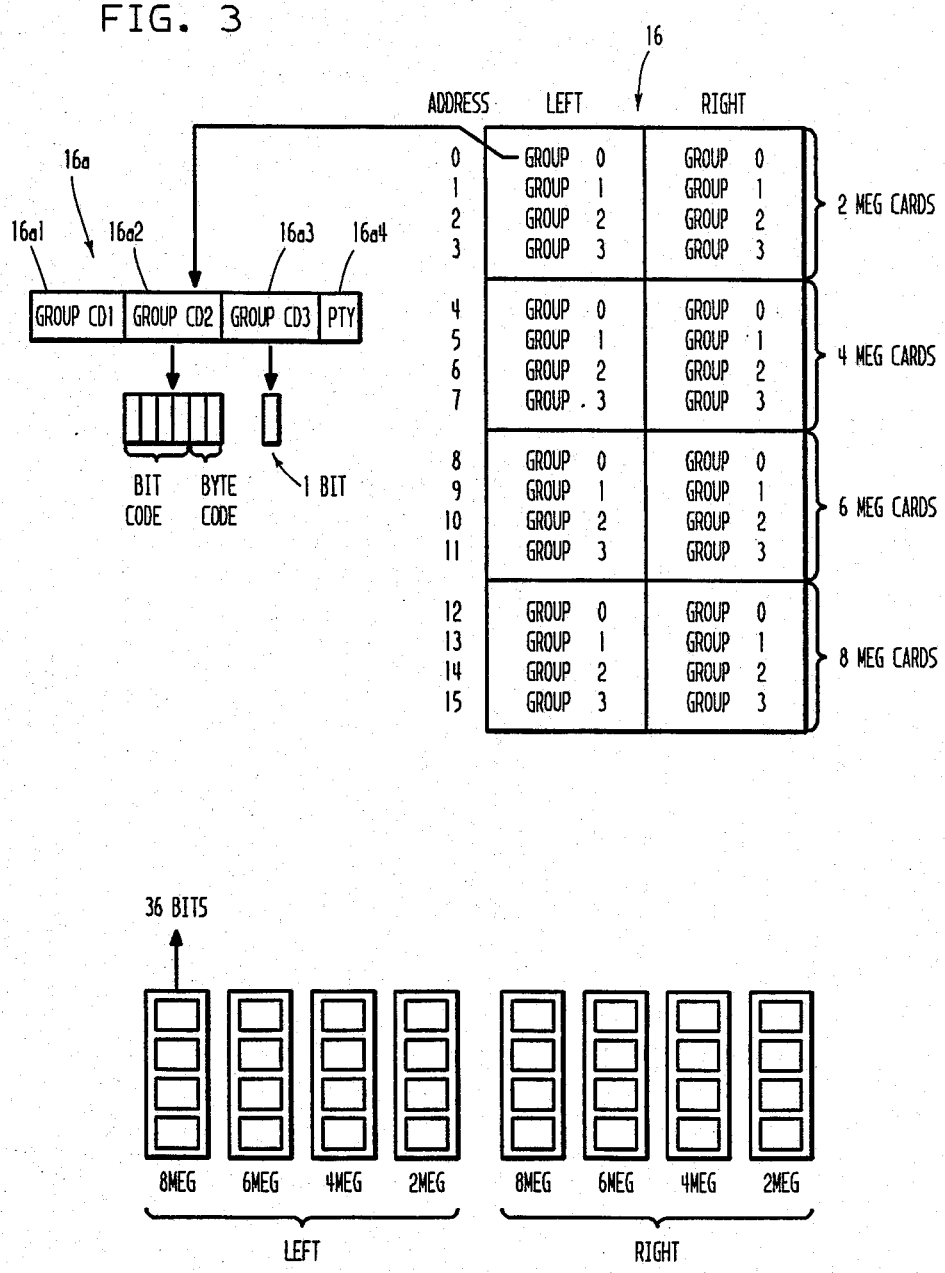
FIG. 3 illustrates the contents of the alternate memory array, a portion of the apparatus of FIG. 2, for storing information regarding the one bit of the double bit error therein.

FIG. 3 illustrates the contents of the alternate memory 16 of FIG. 2 which stores information relative to the operative condition of the individual cells assoicated with the memory chips comprising each group of the memory cards 10a within the memory unit 10. In FIG. 3, eight memory cards are illustrated, the left four cards are associated with the left portion of the alternate memory, the right four cards are associated with the right portion of the alternate memory 16. The information stored in the alternate memory 16 comprises a plurality of group codes 16a. Each group of each memory card has associated therewith a group code 16a stored in the alternate memory 16 (recall that, in the preferred embodiment, there are 36 memory chips per group). The group code 16a comprises a group code (1) 16a1 including 16 bits representing the address of the group stored in memory unit 10, group code (2) 16a2 including a number of bits constituting a byte code and a further number of bits constituting a bit code, the byte code and the bit code identifying the byte and the bit of the byte associated with the data stored at the address of the group associated with group code (1), group code (3) 16a3 including one bit representing a corrected bit associated with one bit of a double bit error, and a parity bit 16a4. The group codes 16a, associated with each group of a memory card, are stored in selected address locations of the alternate memory array 16, the address locations being the same as the address locations of the corresponding chips associated with a group of the memory card 10a in memory unit 10 in which the corresponding data is stored.

Figure 4:
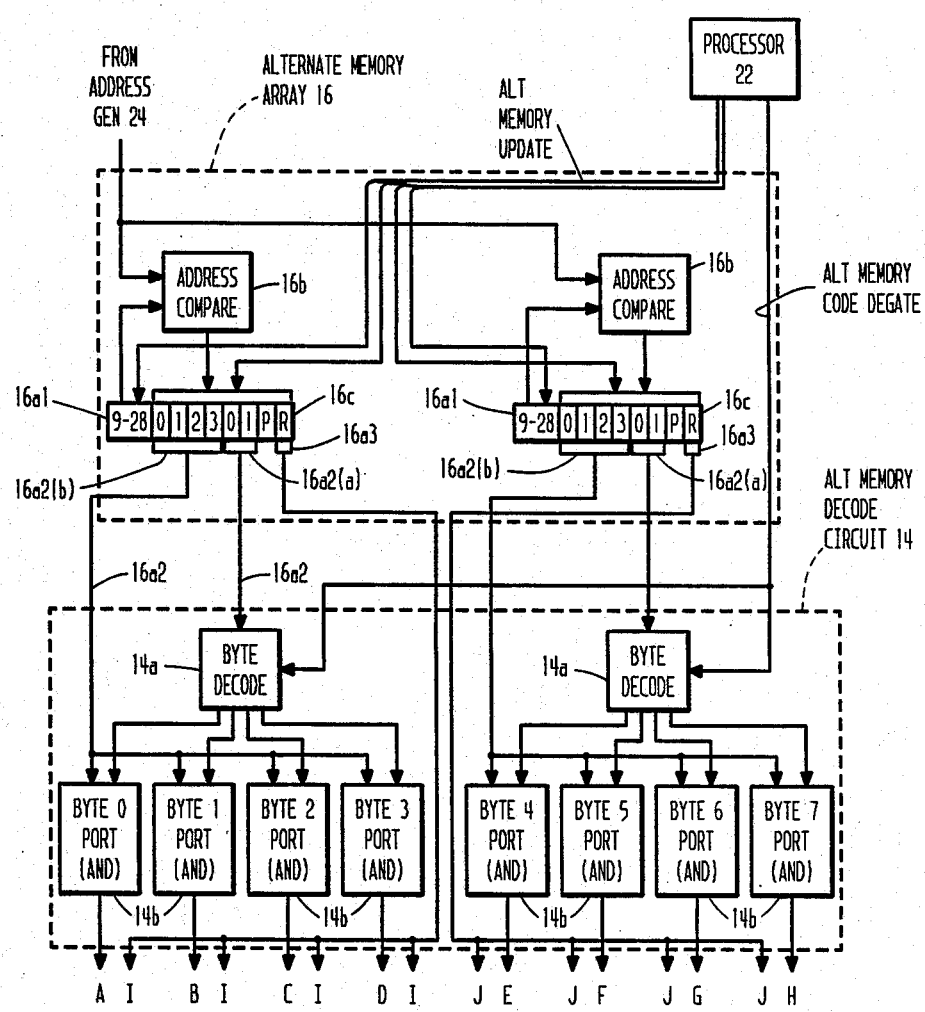
FIG. 4 illustrates the construction of the alternate memory decode circuitry, a portion of the apparatus of FIG. 2, for decoding the information stored in the alternate memory.

FIG. 4 illustrates the construction of the alternate memory 16 and the alternate memory decode circuit 14 shown in FIG. 2. The alternate memory 16 is connected to the alternate memory decode circuit 14 and communicates a bit code and a byte code, associated with a selected group code, to the alternate memory decode circuit 14. The alternate memory decode circuit 14 decodes the bit code and byte code. In FIG. 4, the alternate memory array 16 comprises a pair of address compare circuits 16b and a pair of registers 16c connected to the address compare circuits 16b. The registers 16c contain an address 16a1, representative of the address of a series of cells corresponding to a chip in a group of a memory card, a byte code 16a2(a) identifying a particular byte of the data stored at said address representing the series of cells, a bit code 16a2(b) identifying a bit within said particular byte, a parity bit, and a corrected bit 16a3 representative of a corrected bit to be used in lieu of a faulty, incorrect bit stored in one of the series of cells at said address. The address 16a1 is stored as group code (1) 16a1 shown in FIG. 3. The byte code and the bit code 16a2(a) and 16a2(b)) is stored as group code (2) 16a2 shown in FIG. 3. The corrected bit 16a3 is stored as group code (3) 16a3 shown in FIG. 3. The portion of said register 16c which contains the address 16a1 is connected to one input terminal of the address compare circuit 16b. The other input terminal of the address compare circuit is connected to address generator 24. The output terminal of said address compare circuits 16b is connected to the portion of said register 16c which contains the bit code 16a2(b), the byte code 16a2(a). and the corrected bit 16a3. The pair of registers 16c are connected to processor 22 via the "alt memory update" lines.

In FIG. 4, a pair of group codes 16a are addressed in the alternate memory array 16, the bit codes 16a2(b) and bytes codes 16a2(a) of which are transmitted to the alternate memory decode circuit 14. The alternate memory decode circuit 14 comprises a pair of byte decode circuits 14a for receiving the byte codes from register 16c. The byte decode circuits 14a are also connected to processor 22 via the "alt memory code degate" line. Each byte decode circuit 14a is connected to one input terminal of four AND gates 14b, otherwise known as byte ports, that is, byte 0 port, byte 1 port, byte 2 port, and byte 3 port. The other input terminal of the four AND gates 14b receives the bit codes from register 16c. In accordance with the byte code received by the byte decode circuit 14a, one of the four AND gates 14b (or byte ports) are selected by the byte decode circuit 14a. Although each of the AND gates 14b are connected to the data buffering circuit 12, an output signal is generated from only one of the four AND gates 14b, in response to the bit code received by the one AND gate 14b. The output signal energizes the data buffering circuit 12, and is representative of the identity or address of a defective memory cell associated with a memory chip of a selected group on a memory card 10a disposed within the memory unit 10. The alternate memory decode circuit 14 receives the corrected bit 16a3 from the alternate memory array 16 and generates an output signal therefrom representative of the corrected bit.

Figure 5:
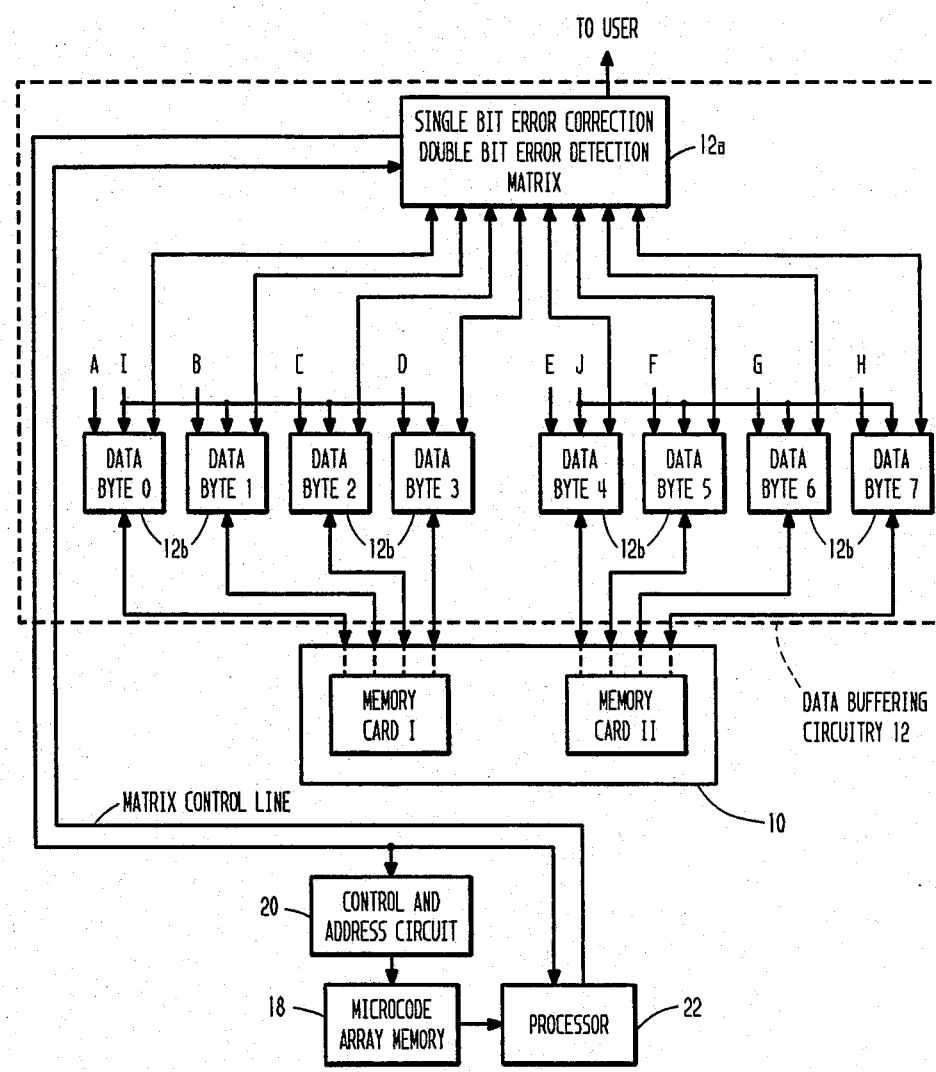
FIG. 5 illustrates the construction of the data buffering circuitry, a portion of the apparatus of FIG. 2, for receiving the data from the memory cards within the memory unit, detecting the existence of errors in said data, when corrected, steering one of the corrected bits of the erroneous data to a spare portion of the alternate memory array, and steering the other corrected bits of the erroneous data to their original storage locations within the memory unit.

FIG. 5 illustrates the construction of the data buffering circuit 12 of FIG. 2 responsible for receiving the accurate (non-erroneous) data from the memory cards within the memory unit, receiving the corrected bit from the spare location (group code (3)) 16a3 in the alternate memory array 16, and sending the accurate data, inclusive of the corrected bit, to a user.

The data buffering circuit 12 also detects the existence of a single bit error or a double bit error. If the error is a double bit error, a corrected bit of said data constituting the double bit error is stored in a spare location 16a3, group code (3), in the alternate memory array 16. The remaining bits of the data are steered to their original storage locations within the memory cards.

In FIG. 5, the data buffer circuit 12 comprises a single bit error correction/double bit error detection matrix 12a connected to the processor 22 (microcode decode circuit) and to the microcode array memory 18 via the control and address circuitry 20. The matrix 12a determines whether a single bit error or a double bit error exists in the data read from memory unit 10, corrects the erroneous bit in the event the error is a single bit error, and notifies the processor 22 and memory 18 of the existence of a double bit error in the event the error is double bit error. The matrix 12a is not capable of determining which two bits of the data read from memory unit 10 constitute the double bit error. It therefore cannot correct the two bits.

The matrix 12a is connected to a plurality of latch circuits 12b, otherwise known as data byte 0, data byte 1, . . . , data byte 7. In the preferred embodiment, there are eight (8) latch circuits 12b, data byte 0 through data byte 7. The reason for this number of latch circuits 12b is as follows: in the preferred embodiment, there are thirty-six (36) memory chips per memory group. The 36 chips may be divided into four (4) nine-chip sub-groups, each nine chip subgroup being associated with one latch circuit 12b. Therefore, for a first memory group, there are four latch circuits 12b, data byte 0 through data byte 3. For the second memory group, there are four latch circuits 12b, data byte 4 through data byte 7, etc.

Each of the latch circuits 12b are also connected to a corresponding, respective output terminal of one of the AND gates (byte ports) 14b of FIG. 4. Further, each of the latch circuits 12b are connected (via memory code decode circuit 14) to an output terminal of register 16c representing the corrected bit 16a3. A first output terminal of each latch circuit 12b is connected to nine (9) consecutive memory chips within a group of a memory card 10a of the memory unit.

Figure 6A:
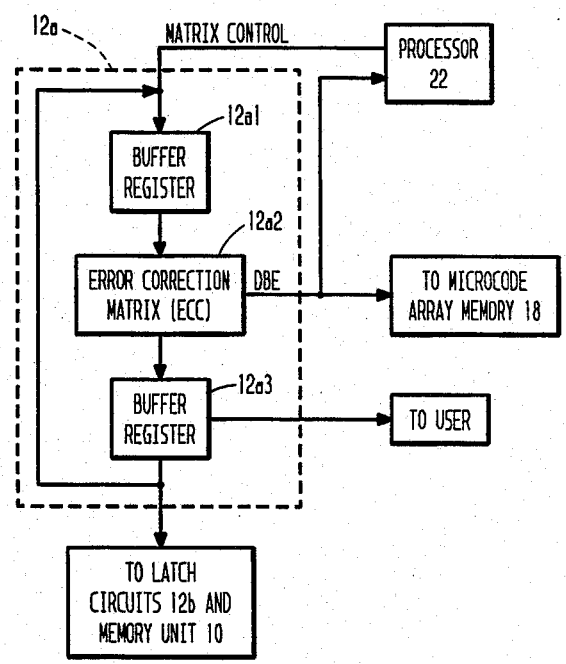
FIGS. 6a and 6b illustrate the construction of the single bit error correction/double bit error detection matrix shown in FIG. 5.
Figure 6B:
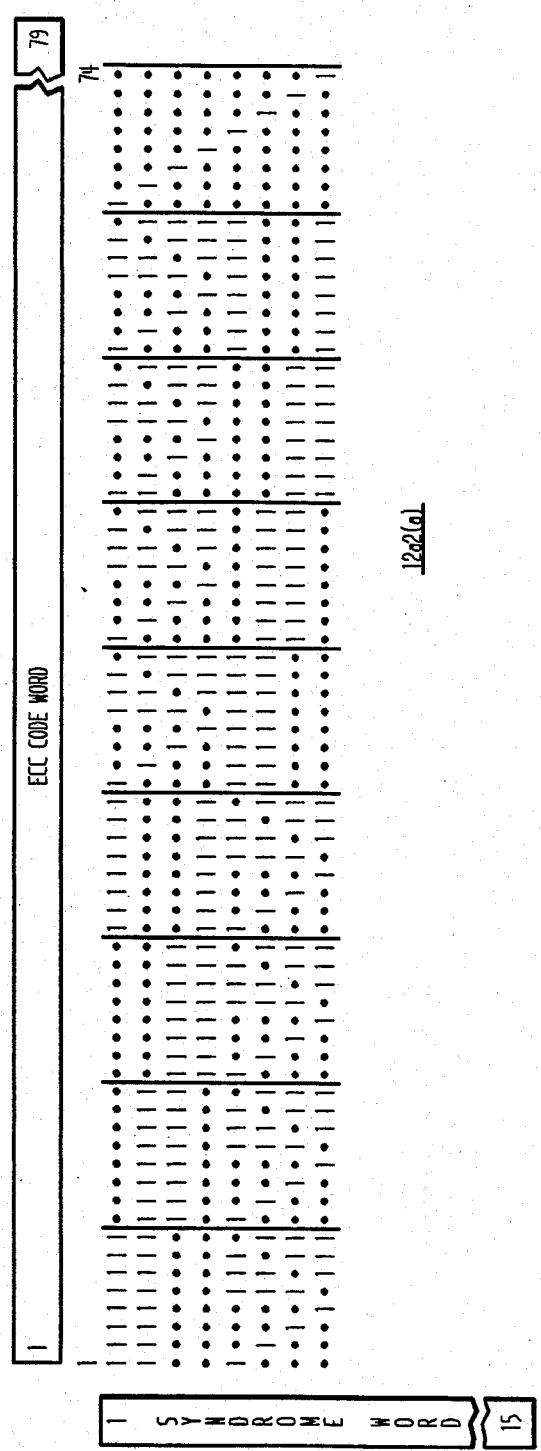

FIGS. 6a and 6b illustrate the construction of the single bit error correction/double bit error detection matrix 12a shown in FIG. 5. In FIG. 6a, the matrix 12a includes a buffer register 12a1, an error correction code matrix (ECC) 12a2 connected to the buffer register 12a1, and another buffer register 12a3 connected to the ECC matrix 12a2. Buffer register 12a1 receives an input from processor 22 via the "matrix control" line. The ECC matrix 12a2 is connected to processor 22 and to microcode array memory 18 for informing the processor 22 and the memory 18 of the existence of the double bit error. The buffer register 12a3 provides an output terminal to a user and an output terminal to latch circuits 12b and memory unit 10.

The ECC matrix 12a2 is a hardware implementation of a matrix similar to the matrix 12a2(a) shown in FIG. 6b. The matrix 12a2(a) comprises a plurality of rows, each row including a plurality of binary 1s and 0s stored therein. A space is reserved at the end of each row of the matrix for the storage of a check bit therein. A check bit is generated and stored in the space at the end of each row of the matrix in the following manner: data is read from memory unit 10; the data overlays each row of the matrix 12a2(a); a check bit 1 or check bit 0 is generated depending upon the combination of 1s and 0s in the row of the matrix and upon the combination of 1s and 0s in the data overlaying the row of the matrix; the check bit is stored in the space at the end of each row of the matrix. Since the combination of 1s and 0s in the rows of the matrix is always fixed, and since the combination of 1s and 0s in the data read from memory unit 10 varies depending upon the existence of a single bit or double bit error, the generated check bit for each row of the matrix represents the data overlaying said each row. The check bits are utilized to determine if an error in the data is a single bit error or a double bit error. The manner in which the check bits are so utilized will become apparent from a reading of the functional description of the invention in the paragraphs below.

Figure 7:
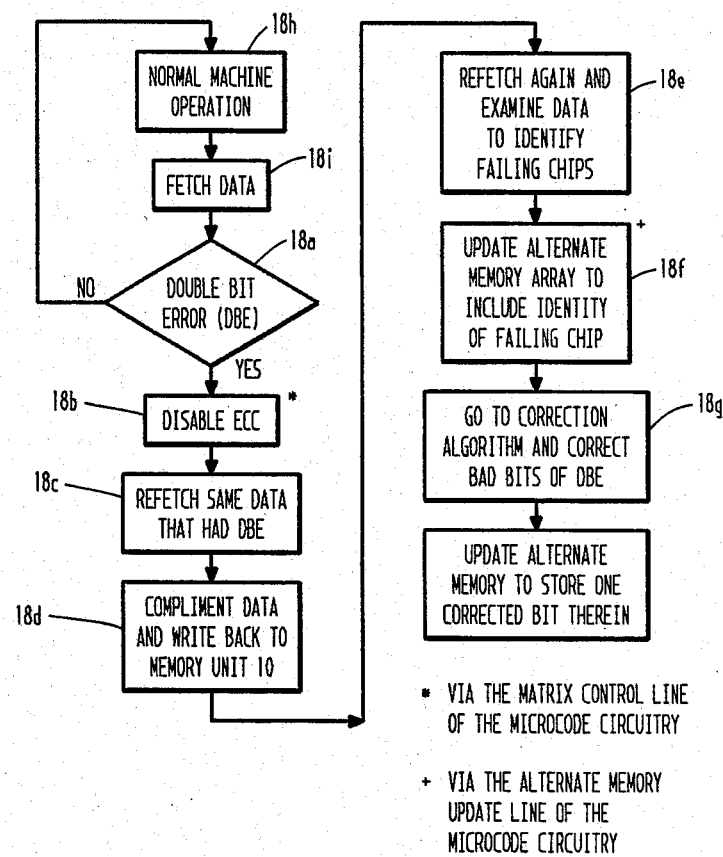
FIGS. 7 and 8 illustrate an algorithm representing a program stored in the microcode array memory, a portion of the apparatus of FIG. 2, for determining the identity of the defective cells in the chips of a group in a memory card, and for correcting the data stored in the defective cells.
Figure 8:
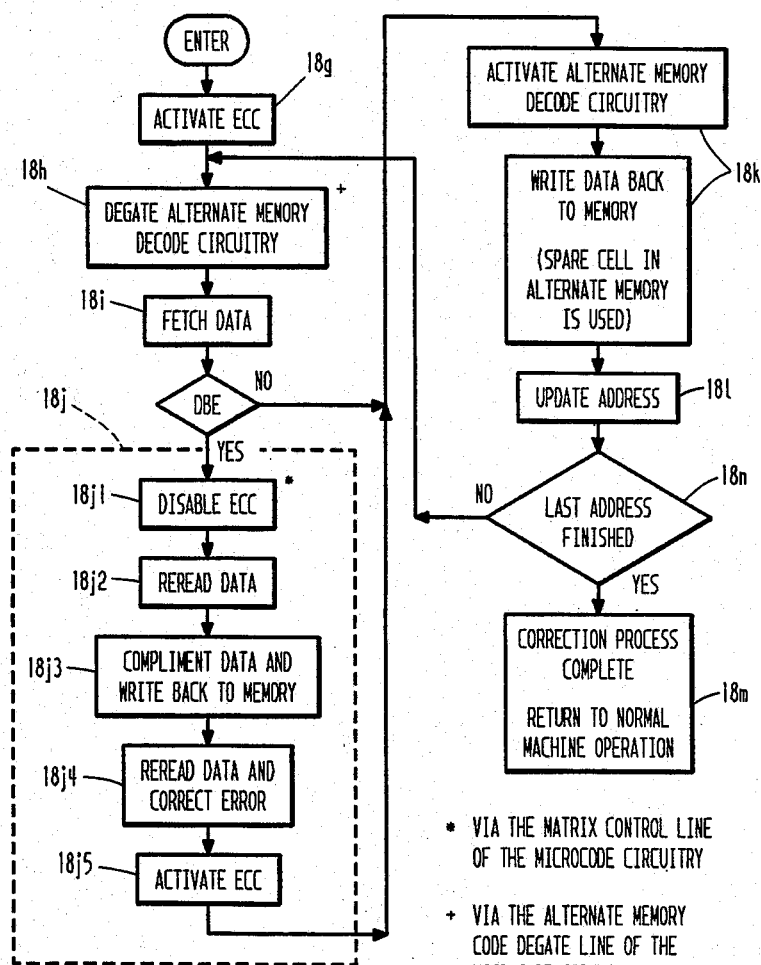

FIGS. 7 and 8 illustrate an algorithm representing the program stored in the microcode array memory 18 of FIG. 2 responsible for determining, with the assistance of processor 22, the specific bits in error in the event a double bit error is detected by the ECC matrix. When the specific bits in error are identified, the defective cells within the corresponding memory chips of a memory card are identified. The program in memory 18 is also responsible for correcting the data previously stored in the defective cells. FIGS. 7 and 8 will be discussed in detail below as a part of the description of the functional operation of the present invention.

The functional operation of the present invention will now be described in the following paragraphs with reference to FIGS. 1 through 8 of the drawings.

If processor 22 writes data into memory unit 10, the data is transmitted to the memory unit 10 via the error correction code (ECC) matrix 12a2. The data overlays each row of a matrix similar to matrix 12a2(a). The binary data in each row of the matrix is compared with the data being transmitted to the memory unit 10. In response to this comparison, a check bit is generated for each row of the matrix. For example, an 8-row matrix 12a2(a) shown in FIG. 6b results in a 8-binary bit check 12a2(a) number associated with the data being written into memory unit 10. The 8-binary bit check bit number is stored with the data in memory unit 10.

In FIG. 2, a read request is received from an external source via the "memory read or write request" line shown in the figure. As a result of the read request, data, including the check bit number, is read from a corresponding group of memory cards 10a within the memory unit 10 and is transmitted to the data buffer circuitry 12 via lines 0 through 71 shown in FIG. 2. As a result, utilizing the embodiment of invention shown in FIG. 2, data, stored in memory chips 0 through 35 and 36 through 71 corresponding to a group in two respective memory cards 10a, including the check bit numbers, is transmitted to the "single bit error correction/double bit error detection" matrix 12a of FIG. 5 via lines 0 through 71 of FIG. 2 and latch circuits 12b (e.g. data bytes 0 through 3 and 4 through 7) of FIG. 5. Referring to FIG. 6a, the data read from memory unit 10, and its associated check bit number, is transmitted to the error correction code (ECC) matrix 12a2 of matrix 12a via the buffer register 12a1 of matrix 12a. When the data enters the ECC matrix 12a2, it overlays each row of a matrix or grid similar to matrix 12a2(a) shown in FIG. 6b. The binary data read from memory unit 10 is compared with the binary data in each row of the matrix or grid (12a2(a)) and a check bit is generated associated with each row of the matrix or grid (12a2(a)). The generated check bits associated with each row of the matrix or grid (12a2(a)) are compared with the check bit number read from memory with the data. As a result of the comparison of check bits, a determination is made regarding the presence of a single bit error or a double bit error in the data read from memory unit 10.

When the read request is received by the memory unit 10, via the "memory read or write request" line, a specific address of the memory unit 10 is interrogated for data. As mentioned above, in response to this addressing, the data stored in chips 0 through 71 of a group of two memory cards is read therefrom. Concurrently with the addressing of memory unit 10, a further specific address of the alternate memory array 16 is interrogated, the further specific address being the same address location as the the specific address of the memory unit 10. The further specific address interrogating the alternate memory array 16 is compared with the address information stored in address 16a1 of register 16c shown in FIG. 4 via the address compare circuit 16b. If a match is found during the comparison, a byte number is read from byte code 16a2(a) of register 16c and a bit number is read from bit code 16a2(b) of register 16c of alternate memory array 16. The byte number and bit number are transmitted to the alternate memory decode circuit 14. The byte number is received by the byte decode circuit 14a within the alternate memory decode circuit 14. The byte decode circuit 14a decodes the byte number and, based on the byte number, generates one output signal energizing one of the AND gates (byte ports) 14b.

The bit number associated with bit code 16a2(b), read from the alternate memory array 16, is a four bit binary number and designates one of the memory cells associated with a memory chip as being a defective cell. For example, a bit number of 1111 would indicate that none of the memory cells, associated with any of the memory chips from which the data was withdrawn, are defective. The bit number energizes each of the AND gates 14b. In response to the bit number and to the one output signal from the byte decode circuit 14a, an output signal is generated from one of the AND gates (byte ports) 14b.

However, for the purposes of this discussion, assume that the bit number is 1111. If the bit number is 1111, an output signal is not generated from any of the AND gates 14b. Therefore, latch circuits 12b are not energized by any of the output signals from AND gates 14b. As a result, all of the data, withdrawn from memory unit 10, is read from memory chips 0 through 35 associated with one memory card and memory chips 0 through 35 associated with the other memory card, that is, none of the data is read from the spare location in register 16c wherein the corrected bit 16a3 is stored, otherwise known as group code (3) of FIG. 3.

If the error correction code (ECC) matrix 12a2 determines that a single bit error is present in the data withdrawn from memory unit 10 (only one bit appears to be erroneous), the matrix 12a2 corrects the erroneous bit associated with the single bit error, and either transmits the corrected data to buffer register 12a3 and to the user or transmits the corrected data to the processor 22 for further processing.

However, in FIG. 6a, if the error correction code matrix 12a2 determines that a double bit error is present in the data withdrawn from memory unit 10 (two bits appear to be erroneous), the matrix 12a2 generates an output signal energizing memory 18 and processor 22 informing the processor 22 of the existence of the double bit error in the data withdrawn from memory unit 10. The processor 22 executes a program stored in memory 18, the program being represented by the flow charts illustrated in FIGS. 7 and 8 of the drawings.

Referring to FIG. 7, if the ECC matrix 12a2 determines that a double bit error exists (block 18a), the processor 22 disables the ECC matrix 12a2 via the "matrix control line", block 18b. The processor 22 re-reads the data from memory unit 10, block 18c, the data being transmitted to processor 22 via line 24 shown in FIG. 2. The processor 22 compliments the data and stores the data in its original locations within memory unit 10, block 18d. The processor 22 again re-reads the data from memory unit 10. The re-read complimented data is compared with the data originally re-read from memory unit 10, and the two erroneous bits constituting the double bit error are determined, block 18e. When the two erroneous bits are determined, the two memory cells, in which the bits were stored, are also determined. The processor 22 updates the alternate memory array 16, block 18f, via the "alternate memory update" line of FIG. 2, to reflect the identity of only one of the two defective cells (the bit code of the group code 16a is updated to identify the selected defective cell) and to store a corrected bit associated with the one of the two defective cells. At this point, the double bit error has been reduced to a single bit error; and, as previously mentioned, the error correction code (ECC) matrix 12a2 is capable of correcting single bit errors.

Referring to FIG. 8, as indicated by block 18g, the processor 22 activates the ECC matrix 12a2, and degates the alternate memory decode circuitry 14, as indicated by block 18h. The data is again re-read from memory unit 10, block 18i. If a double bit error still exists (since the alternate memory decode circuitry has been degated, the double bit error which originally existed should still exist), as indicated by block 18j of FIG. 8, the processor 22 again disables the ECC matrix 12a2, re-reads the data from memory unit 10, compliments the data and stores the data into memory unit 10, re-reads the data again from memory unit 10, determines the two erroneous bits associated with the double bit error, corrects one of the two erroneous bits, and activates the ECC matrix 12a2. As indicated by block 18k, the processor 22 activates the alternate memory decode circuitry 14 and stores the data into memory unit 10 via the buffer register 12a1, ECC matrix 12a2, buffer register 12a3, and latch circuits 12b. However, since the the ECC matrix 12a2 has been activated and the alternate memory 16 has been activated, check bits are generated associated with the data written into memory unit 10. In addition, processor 22 updates the alternate memory array 16, via the "alt memory update" line, to store a corrected bit, one of the two corrected erroneous bits, in the corrected bit location 16a3, group code (3), of register 16c. The remaining bits of the data have been stored in their original locations of memory unit 10. At this point, the double bit error has been reduced to a single bit error. The ECC matrix is capable of correcting the erroneous bit associated with a single bit error.

Assume that the same data, originally read from memory unit 10 and possessing the double bit error, is again re-read from the memory unit 10. As indicated above, the original double bit error has been reduced to a single bit error. One of the bits associated with the double bit error has been corrected and stored in the spare location of the alternate memory array known as group code (3) 16a3 whereas the other bit has been restored into its original location in memory unit 10 (in one of the two defective cells in memory which caused the double bit error). When the same data is re-read, either by processor 22 or by an external source, the alternate memory 16 is interrogated at an address corresponding to the address location of data in memory unit 10. A group code 16a is read from the alternate memory 16. This particular group code has already been updated, as indicated in the above paragraphs. That is, one of the corrected bits of erroneous data at this address location has been stored in the group code (3) 16a3 location of the alternate memory array 16. The bit code 16a2(b) associated with the group code 16a read from the alternate memory 16 energizes the AND gates 14b. The byte code 16a2(a) energizes the byte decode circuit 14a, of FIG. 4. One of the AND gates 14b is energized by an output signal generated from the byte decode circuit 14a and by an output signal representative of the bit code 16a2(b). As a result, an output signal is generated from the one AND gate 14b, that is, from one of AND gates identified by byte 0 port, byte 1 port, byte 2 port, byte 3 port, byte 4 port, byte 5 port, byte 6 port, and byte 7 port. Assume that output signals C and G are generated from AND gates 14 b, as shown in FIG. 4. Output signal C energizes latch circuit 12b (data byte 2) and output signal G energizes latch circuit 12b (data byte 6). Recall that output signal C and output signal G actually comprise the bit codes from their respective group codes, a bit code identifying a particular cell in a memory chip as being defective. An output signal from the corrected bit 16a3 spare location of register 16c in the alternate memory array 16 is generated indicative of a corrected bit, the output signal being signals I and J shown in FIG. 4. As shown in FIG. 5, output signals I and J energize latch circuits 12b associated with data byte 2 and data byte 6. Since the bit codes associated with output signals C and G also energize these latch circuits 12b, when the data is re-read from memory unit 10, one of the bits associated with the original double bit error is withdrawn from the spare corrected bit 16a3 location of the alternate memory array 16 while the remaining data is read from their locations within the memory unit 10. Latch circuits 12b collect the data. Note that data byte 2 and data byte 6 latch circuits 12b collect data from memory unit 10 and from spare location 16a3 of the alternate memory array 16. As a result, when the data (and its corresponding check bits) is read from memory unit 10, it is transmitted to the error correction code (ECC) matrix 12a2, via the latch circuits 12b, and the buffer register 12a1, associated the "single bit error correction/double bit error detection" matrix 12a. In addition, the bit withdrawn from the spare corrected bit 16a3 location of the alternate memory array 16 is also transmitted to the ECC matrix 12a2 via the latch circuits 12b and the buffer register 12a1. This data, read from memory unit 10 and from spare location 16a3, overlays each row of a matrix similar to matrix 12a2(a) shown in FIG. 6b. When the data read from memory unit 10 and the bit withdrawn from the spare corrected bit 16a3 location is received by the ECC matrix 12a2, each of the bits of the data is compared with each of the bits in each row of the matrix. As a result of this comparison, a check bit is generated for each row of the matrix. The generated check bits are compared with the check bits read from memory unit 10 with the data. A comparison of the two sets of check bits reveals the presence of a single bit error in the data read from memory unit 10. The error correction code matrix 12a2 corrects the single bit error. The re-read data, corrected to eliminate the single bit error, is available for use by processor 22 or by the user.

The invention being thus described, it will be obvious that the same way be varied in many ways. Such variations are not to be regarded as a departure from the spirit and scope of the invention, and all such modifications as would be obvious to one skilled in the art are intended to be included within the scope of the following claims.

I claim:

1. A microprocessor controlled apparatus for reading data from a main memory means, for detecting the existence of a double bit error in said data, for correcting said double bit error without the use of spare memory chips, and for ensuring that said error will not be reproduced during a subsequent read of said data, comprising:

said main memory means for storing said data therein, said data including erroneous and non-erroneous data;

detection means, connected to said main memory means, for detecting the existence of a double bit error in said data read from said main memory means;

first correction means, connected to said microprocessor, for correcting a single bit error of said double bit error detected by said detection means thereby producing partially corrected data and for developing an output signal indicative of said partially corrected data;

common pool alternate memory array means, connected to said detection means and responsive to said output signal developed from said first correction means, for storing said partially corrected data, received from said first correction means, said partially corrected data being simultaneously accessed from said common pool alternate memory array means when said data is accessed from said main memory means, thereby changing said double bit error into a remaining single bit error; and second correction means, connected to said detection means, for correcting said remaining single bit error.

2. The apparatus of claim 1, wherein said second correction means is also for correcting all single bit errors detected by said detection means directly without utilizing said common pool alternate memory array means and said first correction means.

* * * * *